United States Patent
Hsiao et al.

(10) Patent No.: US 8,158,474 B2
(45) Date of Patent: Apr. 17, 2012

(54) SEMICONDUCTOR DEVICE WITH LOCALIZED STRESSOR

(75) Inventors: Ru-Shang Hsiao, Jhubei (TW); Min Cao, Hsin-Chu (TW); Chung-Te Lin, Tainan (TW); Ta-Ming Kuan, Zhongli (TW); Cheng-Tung Hsu, Yun-Ling Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 10 days.

(21) Appl. No.: 12/873,889

(22) Filed: Sep. 1, 2010

(65) Prior Publication Data

US 2010/0330755 A1    Dec. 30, 2010

Related U.S. Application Data

(63) Continuation of application No. 11/738,968, filed on Apr. 23, 2007, now Pat. No. 7,825,477.

(51) Int. Cl.
*H01L 21/0243* (2006.01)
*H01L 23/76* (2006.01)

(52) U.S. Cl. ........................... 438/216; 257/369

(58) Field of Classification Search .............. 438/216; 257/369, 411, E27.064
See application file for complete search history.

(56) References Cited

U.S. PATENT DOCUMENTS

| | | | |
|---|---|---|---|
| 6,303,947 B1 | 10/2001 | Ueno | |
| 6,872,626 B1 | 3/2005 | Cheng | |
| 7,091,563 B2 | 8/2006 | Chidambarrao et al. | |
| 7,262,472 B2 * | 8/2007 | Pidin | 257/410 |
| 7,291,528 B2 | 11/2007 | Chen et al. | |
| 7,394,136 B2 | 7/2008 | Ke et al. | |
| 2005/0269650 A1 | 12/2005 | Pidin | |
| 2006/0151808 A1 | 7/2006 | Chen et al. | |
| 2006/0231826 A1 * | 10/2006 | Kohyama | 257/19 |
| 2007/0013010 A1 | 1/2007 | Wang et al. | |

FOREIGN PATENT DOCUMENTS

| | | |
|---|---|---|
| CN | 1805151 A | 7/2006 |
| CN | 1830092 A | 9/2006 |
| CN | 1897303 A | 1/2007 |

* cited by examiner

*Primary Examiner* — Howard Weiss
*Assistant Examiner* — Steven H Rao
(74) *Attorney, Agent, or Firm* — Slater & Matsil, L.L.P.

(57) ABSTRACT

A semiconductor device, such as a PMOS transistor, having localized stressors is provided. Recesses are formed on opposing sides of gate electrodes such that the recesses are offset from the gate electrode by dummy spacers. The recesses are filled with a stress-inducing layer. The dummy recesses are removed and lightly-doped drains are formed. Thereafter, new spacers are formed and the stress-inducing layer is recessed. One or more additional implants may be performed to complete source/drain regions. In an embodiment, the PMOS transistor may be formed on the same substrate as one or more NMOS transistors. Dual etch stop layers may also be formed over the PMOS and/or the NMOS transistors.

20 Claims, 6 Drawing Sheets

SEMICONDUCTOR DEVICE WITH LOCALIZED STRESSOR

This application is a continuation of patent application ser. No. 11/738,968, entitled "Semiconductor Device with Localized Stressor," filed on Apr. 23, 2007, which application is incorporated herein by reference.

TECHNICAL FIELD

The present invention relates generally to semiconductor devices, and more particularly, to metal-oxide-semiconductor field-effect transistors and methods of manufacture.

BACKGROUND

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOSFET) or for p-channel (PMOSFET) devices. Generally, it is desirable to induce a tensile strain in the n-channel of an NMOSFET transistor in the source-to-drain direction to increase electron mobility and to induce a compressive strain in the p-channel of a PMOSFET transistor in the source-to-drain direction to increase hole mobility. There are several existing approaches of introducing strain in the transistor channel region.

In another approach, strain in the channel is introduced by creating a recess in the substrate in the source/drain regions. For example, a PMOS device may have a stress-inducing layer such as SiGe is epitaxially grown within the recessed regions extending above a surface of the substrate, thereby introducing strain in the channel. The amount of stress may be increased by increasing the Ge concentration during the growth process. Increasing the Ge concentration in the recessed area, however, creates process challenges. For example, increasing the Ge concentration during the epitaxial growth results in a higher density of dislocations and defects in the SiGe layer. Degraded selectivity and deposition process windows are also of concern.

In combination with the stress-inducing layer in the recesses in the source/drain regions, contact etch stop layers have also been used. In this approach, contact etch stop layers are formed over the transistor such that the etch stop layer exerts stress in the channel region of the underlying transistor. The contact etch stop layer may be different for NMOS and PMOS devices, which is referred to as a Dual Contact Etch Stop Layer (D-CESL).

The raised source/drain regions, however, buffers the effect of the contact etch stop layers and degrading the stress effect of the contact etch stop layer. Accordingly, there is need for a method to induce strain in the channel region such that the performance characteristics of transistors are enhanced.

SUMMARY OF THE INVENTION

These and other problems are generally reduced, solved or circumvented, and technical advantages are generally achieved, by embodiments of the present invention, which provides a strained semiconductor device to improve the operating characteristics of the semiconductor device and a method of manufacture.

In accordance with an embodiment of the present invention, a semiconductor device having a stressed channel region is provided. The semiconductor device includes a transistor having a gate electrode with spacers formed alongside thereof. Source/drain regions are formed on opposing sides of the gate electrode and include a recess aligned with the spacers. The source/drain regions may be silicided and a stress layer may be formed over the transistor.

In accordance with another embodiment of the present invention, a semiconductor device having a stressed channel region is provided. The semiconductor device includes a transistor having a gate electrode. Epitaxially grown regions are located on opposing sides of the gate electrode, but are offset away from the gate electrode. Spacers are formed on opposing sides of the gate electrode and extend over the epitaxially grown regions. Portions of the epitaxially grown regions extending beyond the spacers are recessed. The source/drain regions may be silicided and a stress layer may be formed over the transistor. Furthermore, the semiconductor device may include additional transistors with or without the epitaxially grown regions.

In accordance with yet another embodiment of the present invention, a semiconductor device having a stressed channel region is provided. The semiconductor device includes a first transistor and a second transistor. One of the transistors have the source/drain regions comprising an epitaxially grown region. The source/drain regions extending beyond the spacers of both transistors are recessed. The source/drain regions may be silicided and a stress layer may be formed over the transistor.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
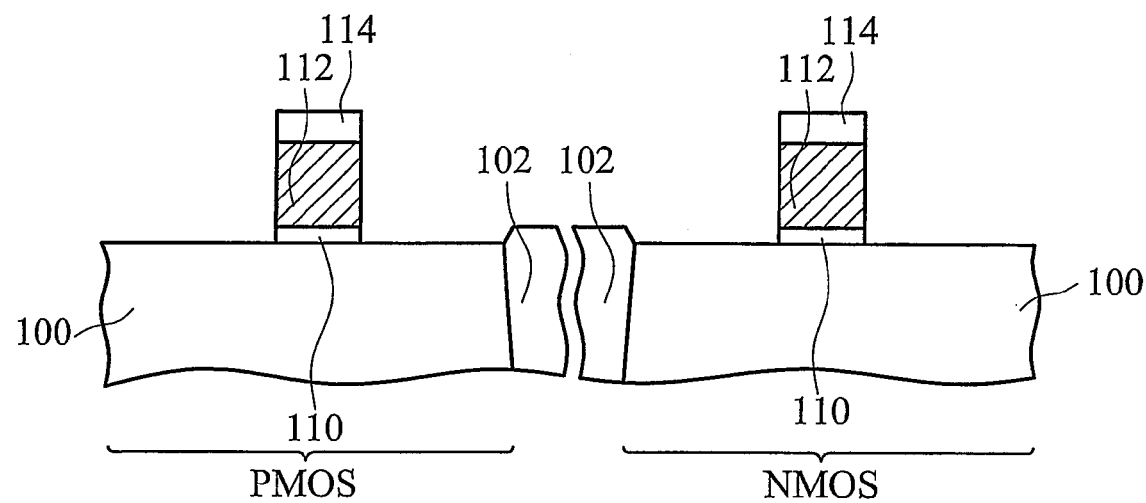
FIGS. 1-11 illustrate various process steps of fabricating a semiconductor device having a stressed channel region in accordance with an embodiment of the present invention.

FIGS. 1-11 illustrate a method embodiment for fabricating a semiconductor device having a strained channel region in accordance with an embodiment of the present invention. Embodiments of the present invention illustrated herein may be used in a variety of circuits. Referring first to FIG. 1, a portion of a substrate 100 having a PMOS region and an NMOS region is shown in accordance with an embodiment of the present invention. The substrate 100 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The NMOS region will be used to accommodate a subsequent NMOSFET device, and the PMOS region of substrate 100 will be the location for a PMOSFET device. An isolation region, such as an insulator filled a shallow trench isolation (STI) 102, may be formed in an area of substrate 100 where physical isolation of the MOSFET regions is desired. The STI 102 may comprise silicon oxide deposited by chemical vapor deposition (CVD) techniques. Other isolation structures, such as a thermally grown field oxide (FOX) region or the like, and other materials may also be used. An N-well region (not shown) may be formed in a top portion of substrate 100 in the PMOS region to accommodate a subsequent PMOSFET device. The N-well region may be formed via implantation of an N-type ion, such as arsenic or phosphorous ions.

A gate insulator layer 110, a gate electrode 112, and a first mask 114 are formed and patterned on the substrate 100 as illustrated in FIG. 1. The gate insulator layer 110 is preferably a high-K dielectric material, such as silicon oxide, silicon oxynitride, silicon nitride, an oxide, a nitrogen-containing oxide, a combination thereof, or the like. Preferably, the gate insulator layer 110 has a relative permittivity value greater than about 4. Other examples of such materials include aluminum oxide, lanthanum oxide, hafnium oxide, zirconium oxide, hafnium oxynitride, or combinations thereof.

In the preferred embodiment in which the gate insulator layer 110 comprises an oxide layer, the gate insulator layer 110 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In the preferred embodiment, the gate insulator layer 110 is about 10 Å to about 50 Å in thickness, but more preferably about 15 Å in thickness.

The gate electrode 112 preferably comprises a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof. In one example, amorphous silicon is deposited and recrystallized to create poly-crystalline silicon (poly-silicon). In the preferred embodiment in which the gate electrode is poly-silicon, the gate electrode 112 may be formed by depositing doped or undoped poly-silicon by low-pressure chemical vapor deposition (LPCVD) to a thickness in the range of about 200 Å to about 1000 Å, but more preferably about 800 Å.

The first mask 114 may comprise any suitable material to protect the underlying gate electrode 112 during subsequent processing. In an embodiment, the first mask 114 comprises an oxide or a nitride, such as silicon oxide, silicon oxynitride, silicon nitride, or the like, deposited via LPCVD or via plasma enhanced chemical vapor deposition (PECVD) procedures, to a thickness between about 200 Å and about 1000 Å. Other materials and thicknesses may be used.

The gate insulator layer 110 and the gate electrode 112 may be patterned by photolithography techniques as are known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate insulator layer 110 and the gate electrode 112 as illustrated in FIG. 1. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

Figure 2:
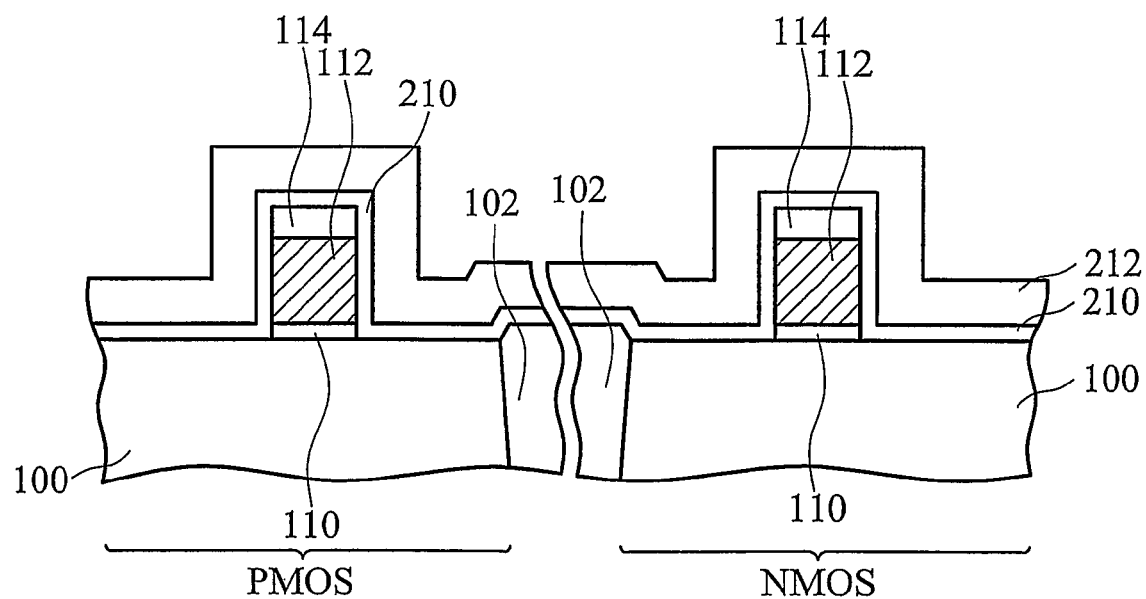

Referring now to FIG. 2, a first dielectric layer 210 and a second dielectric layer 212 are formed over the NMOS region and the PMOS region. Preferably, the material selected to form the first dielectric layer 210 and the second dielectric layer 212 is selected such that a high-etch selectivity exists between the materials used to form the first dielectric layer 210 and the second dielectric layer 212. In this manner, the first dielectric layer 210 may act as an etch stop layer when etching the second dielectric layer 212 in subsequent processing steps.

In an embodiment, the first dielectric layer 210 comprises a TEOS layer formed by chemical vapor deposition (CVD) techniques using tetra-ethyl-ortho-silicate (TEOS) and oxygen as a precursor to a thickness from about 20 Å to about 50 Å. In this embodiment, the second dielectric layer 212 may be formed of silicon nitride via LPCVD or PECVD procedures to a thickness from about 150 Å to about 300 Å. Other materials may be used.

Figure 3:
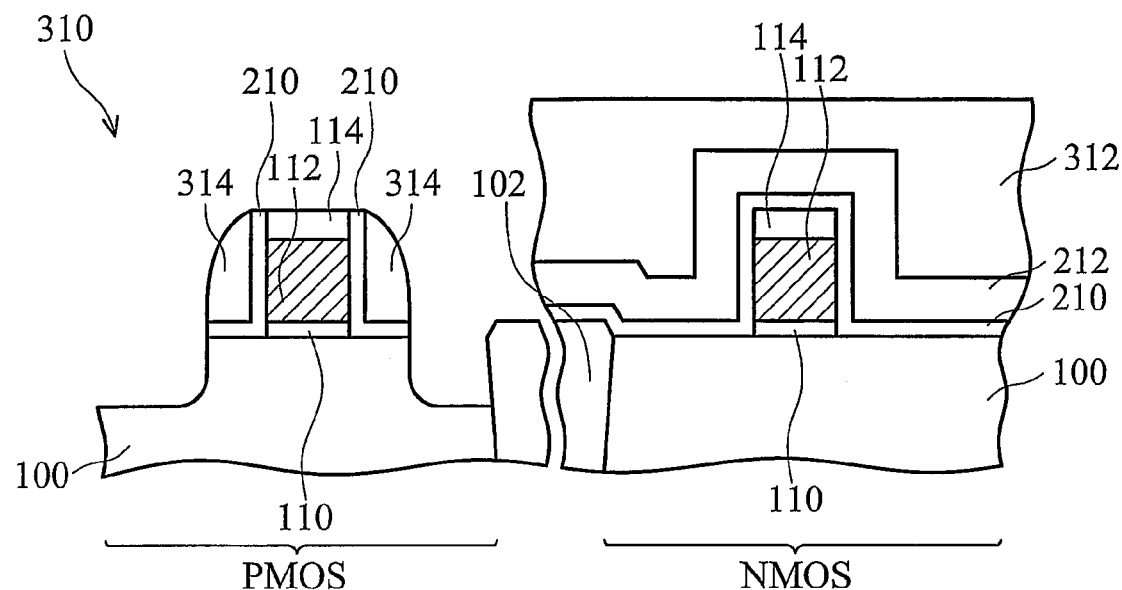

Referring now to FIG. 3, the substrate 100 is shown after an etching process has been performed to create recessed regions 310 in the substrate 100 on either side of the gate electrode 112 in the PMOS region in accordance with an embodiment of the present invention. It should be noted that a photoresist material 312, or another suitable mask, is formed over the NMOS region to protect the NMOS region while the recessed regions 310 are being created.

A selective anisotropic RIE procedure may be performed using $Cl_2$ or $CF_4$ to define a first set of spacers 314 on the portions of the first dielectric layer 210 located on the sides of gate electrode 112 and on the sides of first mask layer 114. The RIE procedure defining the first set of spacers 314 selectively terminate at the appearance of the top surface of the first dielectric layer 210. Thereafter, exposed portions of the first dielectric layer 210 may be removed by, for example, a BHF procedure, thereby exposing portions of the substrate 100 on opposing sides of the gate electrode 112 adjacent the first set of spacers 314.

The recessed regions 310 may be formed by, for example, an anisotropic etch process such as a plasma etch using chlorine and bromine chemistry. Preferably, the recessed regions have a depth from about 600 Å to about 800 Å. An optional anneal may be performed to facilitate silicon migration to repair any etch damage as well as to slightly smoothen the silicon surface for the subsequent epitaxy process.

Figure 4:
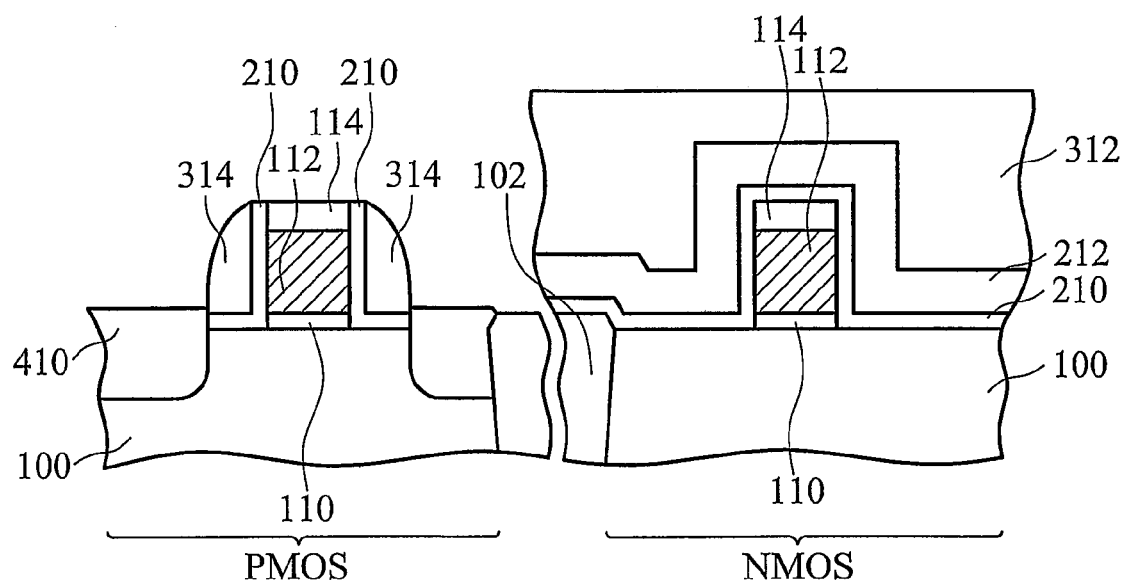

FIG. 4 illustrates the substrate 100 after an epitaxial growth of a stress-inducing layer 410 in the recessed regions 310 of the PMOS region in accordance with an embodiment of the present invention. The stress-inducing layer 410 preferably comprises a first semiconductor material and a second semiconductor material, wherein the presence of the second semiconductor material has a different lattice structure than the first semiconductor material, thereby imparting strain in the channel region. In an embodiment in which a silicon substrate is used, the first semiconductor material may be silicon and the second semiconductor material may be germanium, and therefore, the stress-inducing layer 410 may be a SiGe layer.

Other materials, such as SiC, SiGeN, and SiCN, may be used. The epitaxy process used to perform the epitaxial growth may be CVD, ultra-high vacuum chemical vapor deposition (UHV-CVD), or molecular beam epitaxy. In a preferred embodiment, the stress-inducing layer 410 has a thickness from about 700 Å to about 1100 Å and extends above the surface of the substrate 100 from about 100 Å to about 300 Å.

Figure 5:
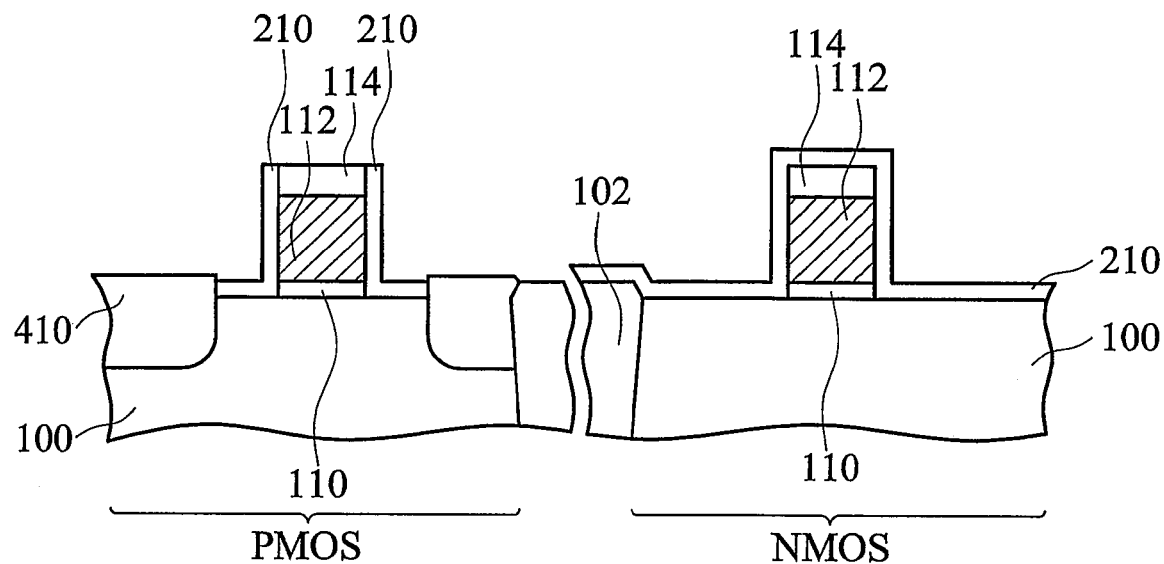

FIG. 5 illustrates the substrate 100 after the photoresist material 312 and the remaining portions of the second dielectric layer 212 have been removed in accordance with an embodiment of the present invention. The photoresist material 312 may be removed, for example, by an $O_2$ plasma dry strip and a mixture of concentrated sulphuric acid and hydrogen peroxide. Other solutions that may be used to remove the photoresist material 312 include a dilute hydrofluoric acid, a mixture of concentrated sulphuric acid and hydrogen peroxide, or the like. Remaining portions of the second dielectric layer 212 may be removed, for example, by an anisotropic RIE procedure using $Cl_2$ or $CF_4$.

Figure 6:
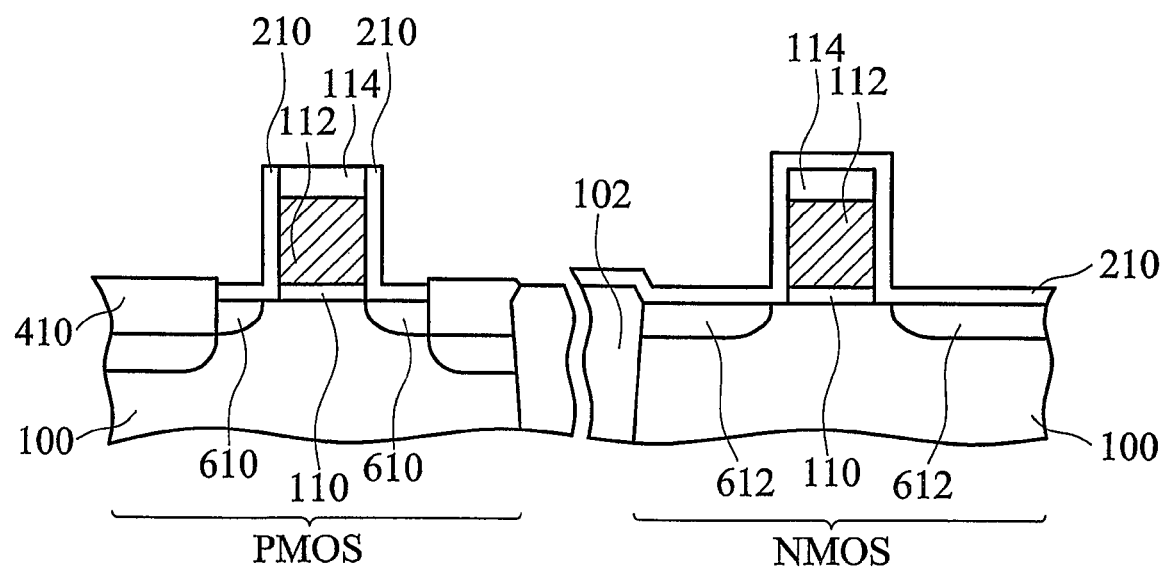

Referring next to FIG. 6, formation of LDD regions 610 and 612 in the PMOS region and the NMOS region, respectively, is illustrated in accordance with an embodiment of the present invention. One of ordinary skill in the art will realize masks, such as a photoresist mask, may be selectively formed over one of the PMOS region and the NMOS region while implanting the other region. For example, in an embodiment a photoresist masking procedure may be used to protect the PMOS region during an implantation of N-type ions, such as arsenic or phosphorous ions, preferably at an energy of about 0.5 and about 3 KeV at a dose of about 5e14 and about 2e15 atoms/$cm^2$ to create N-type LDD regions 612 in the NMOS region. Another photoresist masking procedure may be used to protect the NMOS region during an implantation of P-type ions, such as boron or $BF_2$ ions, preferably at an energy between about 1 and about 5 KeV at a dose between about 5e14 and about 2e15 atoms/$cm^2$. An anneal procedure, such as a rapid thermal anneal (RTA) procedure, may be employed to activate the implanted ions of the LDD regions 610 and 612.

Figure 7:
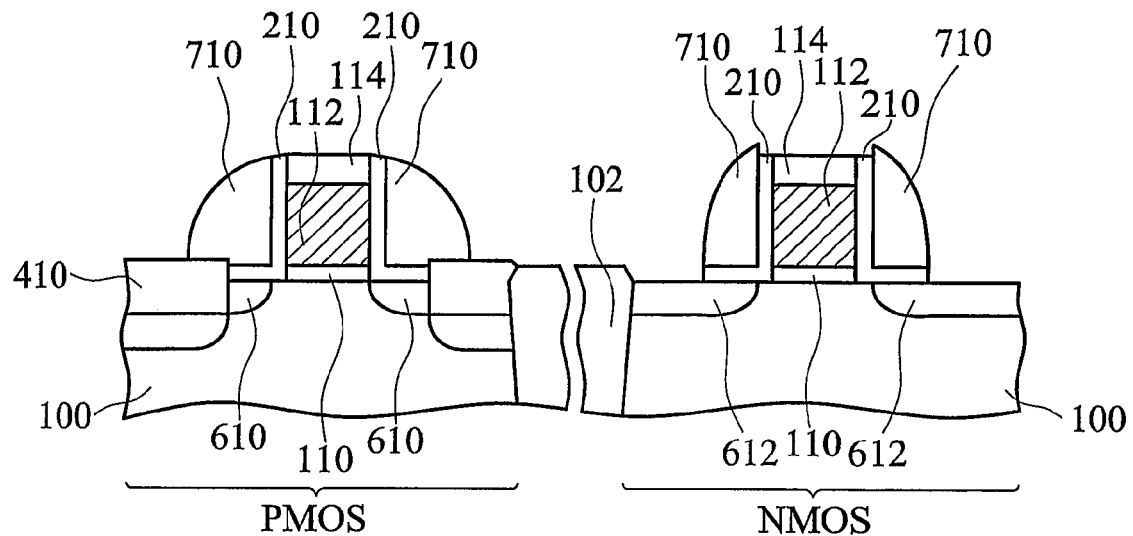

FIG. 7 illustrates formation of a second set of spacers 710 in accordance with an embodiment of the present invention. The second set of spacers 710 may be formed in a manner and of a material similar to the first set of spacers 314 discussed above with reference to FIG. 3. Accordingly, in an embodiment the second set of spacers 710 comprises silicon nitride deposited using LPCVD or PECVD procedures and patterned via a selective anisotropic RIE procedure, which may be performed using $Cl_2$ or $CF_4$. The second set of spacers 710 preferably have a width from about 300 Å to 600 Å, but more preferably about 450 Å.

Figure 8:
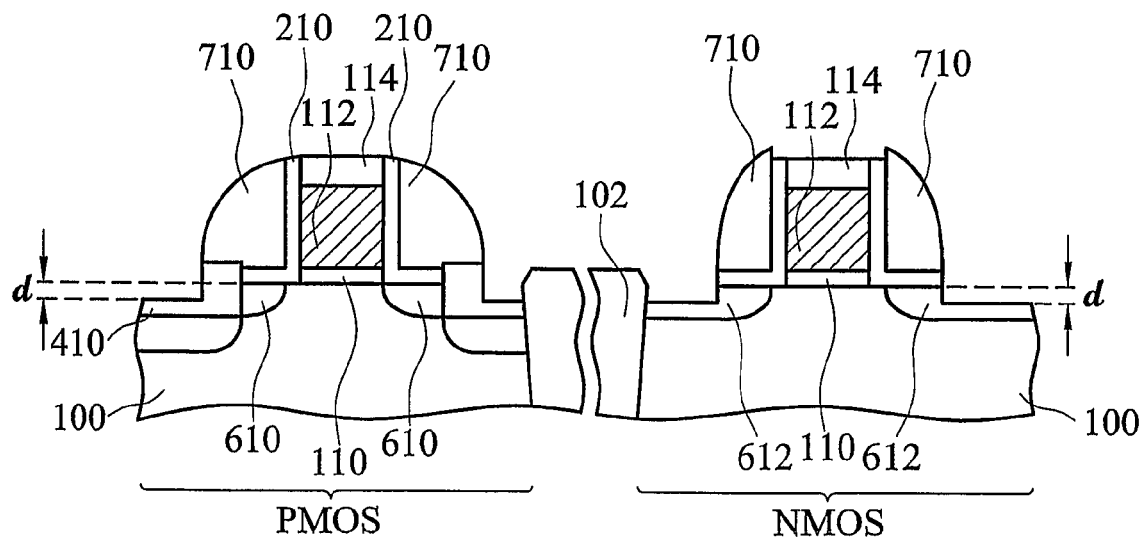

FIG. 8 illustrates the substrate 100 after a recess process has been performed in the PMOS region and the NMOS region in accordance with an embodiment of the present invention. The recess process may be performed by, for example, an anisotropic etch process such as a plasma etch using chlorine and bromine chemistry. Preferably, the recessed regions have a depth d from about 100 Å to about 200 Å below a major surface of the wafer.

Figure 9:
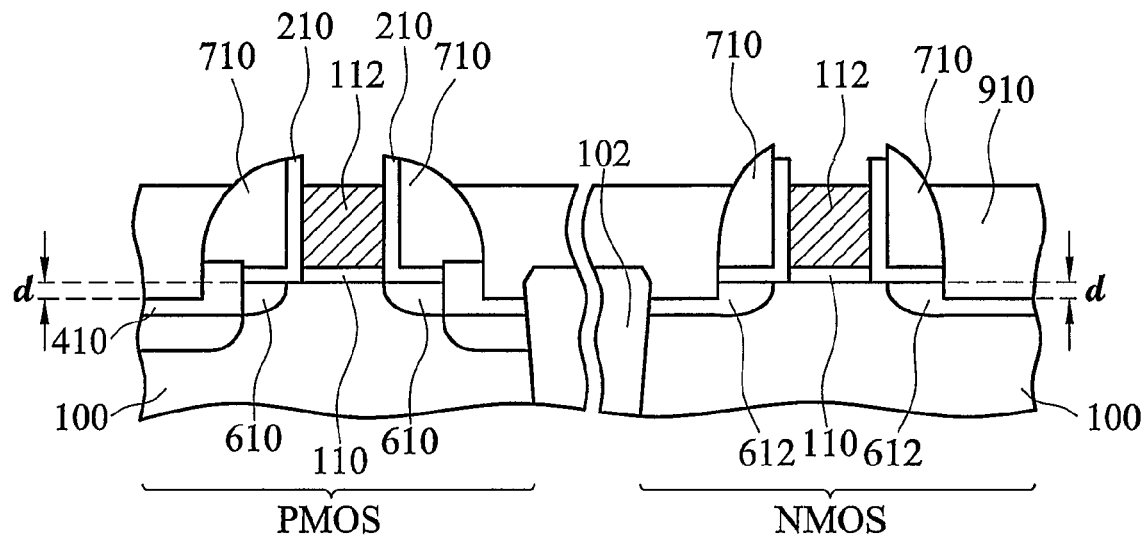

FIG. 9 illustrates the formation of a mask layer 910 and the removal of the first mask 114 over the gate electrodes 112 in accordance with an embodiment of the present invention. The mask layer 910 may be formed of a photoresist material or other masking layer that provides sufficient etch selectivity. In an embodiment, the mask layer 910 is formed by depositing a photoresist material sufficient to cover the first mask 114 formed over the gate electrodes 112 and then performing an etch-back process to expose the first mask 114. The etch-back process may utilize a wet or dry etch process. For example, a wet etch process using a dilute hydrofluoric acid, a mixture of concentrated sulphuric acid and hydrogen peroxide, or the like may be used.

The first mask 114 may be removed, for example, by an anisotropic RIE procedure using $Cl_2$ or $CF_4$, or a wet etch process. It should be noted that portions of the second set of spacers 710 may also be removed in this embodiment.

Figure 10:
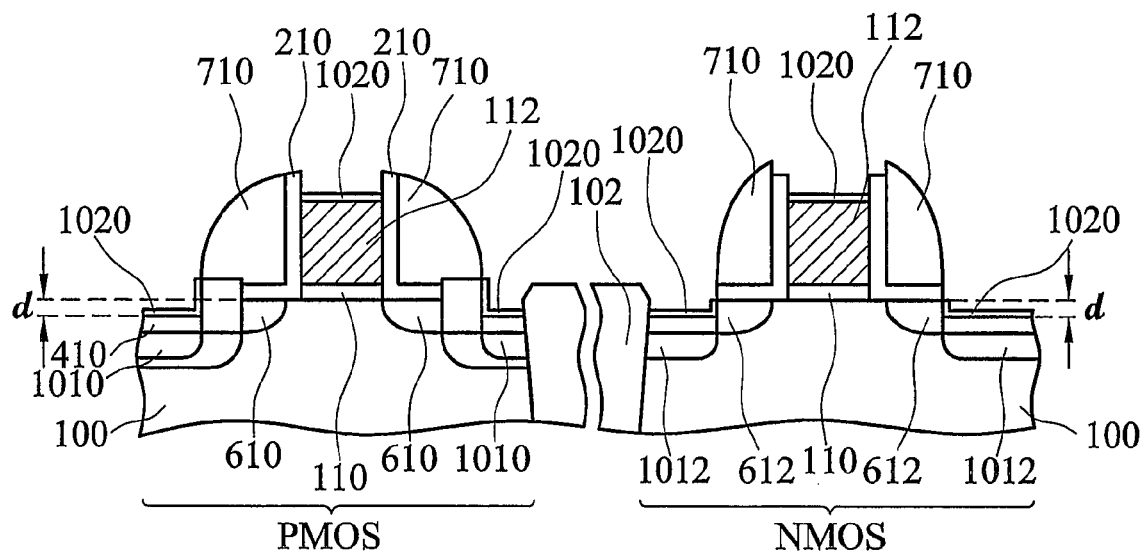

FIG. 10 illustrates the formation of source/drain regions 1010 and 1012 in the PMOS region and the NMOS region, respectively, in accordance with an embodiment of the present invention. One of ordinary skill in the art will realize masks, such as a photoresist mask (not shown), may be selectively formed over one of the PMOS region and the NMOS region while implanting the other region. For example, in an embodiment a photoresist masking procedure may be used to protect the PMOS region during an implantation of N-type ions, such as arsenic or phosphorous ions, preferably at an energy of about 1 and about 20 KeV at a dose of about 1e13 and about 5e15 atoms/$cm^2$ to create N-type source/drain regions 1012 in the NMOS region. Another photoresist masking procedure may be used to protect the NMOS region during an implantation of P-type ions, such as boron or $BF_2$ ions, preferably at an energy between about 1 and about 15 KeV at a dose between about 1e13 and about 5e15 atoms/$cm^2$ to create P-type source/drain regions 1010. An anneal procedure, such as a rapid thermal anneal (RTA) procedure, may be employed to activate the implanted ions of the source/drain regions 1010 and 1012.

FIG. 10 also illustrates optional silicide areas 1020 in accordance with an embodiment of the present invention. The silicide areas 1020 may be formed, for example, by depositing a metal layer (not shown) such as titanium, nickel, tungsten, or cobalt via plasma vapor deposition (PVD) procedures. An anneal procedure causes the metal layer to react with gate electrode 112 and the source/drain regions to form metal silicide. Portions of the metal layer overlying other areas, such as spacers 710 and isolation regions 102 remain unreacted. Selective removal of the unreacted portions of the metal layer may be accomplished, for example, via wet etch procedures. An additional anneal cycle may be used if desired to alter the phase of silicide areas 1020, which may result in a lower resistance.

Figure 11:
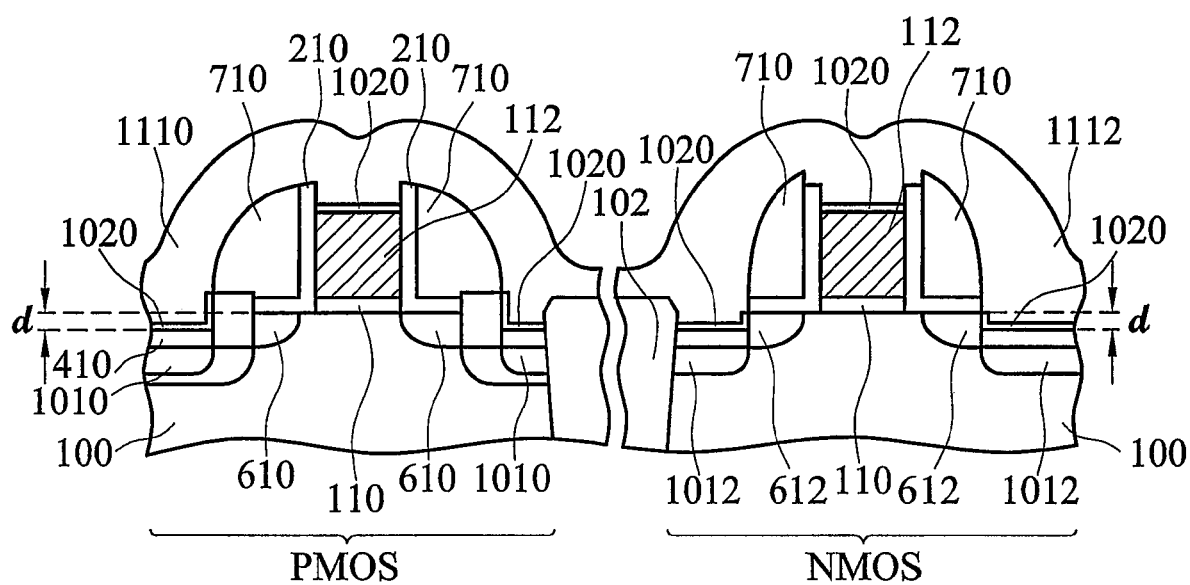

FIG. 11 illustrates substrate 100 after etch stop layers 1110 and 1112 have been formed in the PMOS region and the NMOS region, respectively, in accordance with an embodiment of the present invention. The etch stop layers 1110 and 1112 act as stop layers for subsequent processing steps, such as an etching process to form a contact hole through an inter-layer dielectric (ILD) (not shown) without over-etching. The etch stop layers 1110 and 1112 preferably comprise a dielectric material, such as silicon nitride, silicon oxynitride, or the like. The etch stop layers 1110 and 1112 may also be a composite layer formed of, for example, silicon nitride/silicon dioxide, silicon oxynitride/silicon dioxide, silicon oxynitride/silicon nitride, or the like. In an embodiment, the etch stop layers 1110 and 1112 may be formed of silicon nitride deposited by chemical vapor deposition (CVD) in an ambient of silicon-containing nitrogen-containing gases. The etch stop layers 1110 and 1112 are preferably about 300 Å to about 1000 Å in thickness, but most preferably about 500 Å to about 800 Å in thickness.

In an embodiment, the etch stop layers 1110 and 1112 exert stress in the channel region. In this case, the material used for the etch stop layer 1110 is selected such that the total stress exerted in the channel region of the PMOS region is a compressive stress to increase hole mobility and the etch stop layer 1112 is preferably selected such that the total stress exerted in the channel region of the NMOS region is a tensile stress to increase electron mobility.

It should be noted that embodiments of the present invention may utilize a different number of implants for the PMOS transistor than the NMOS transistor. For example, one type of transistor may be formed using only two implants while the other type of transistor may be formed using three implants. Other combinations of implants and implant masks may be used to further customize a particular NMOS and/or PMOS transistor to a specific application.

One of ordinary skill in the art will appreciate that embodiments of the present invention allows the dual contact etch stop layer to be close to the channel. In particular, recessing the stress layer formed in the source/drain regions allows the overlying contact etch stop layer to be formed closer to the channel region. This may also allow a lower junction leakage to be realized as well as reducing the resistance by increasing the contact area of the silicide area by recessing the source/drain regions and increasing the silicide formation area.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a substrate;
   forming a first gate dielectric and a first gate electrode on the substrate;
   forming first recesses in the substrate on either side of the first gate electrode;
   forming a stress material in the first recesses;
   forming, after the forming the stress material, first spacers on opposing sides of the first gate electrode; and
   forming, after the forming the first spacers, second recesses in the stress material on opposing sides of the first spacers.

2. The method of claim 1, further comprising siliciding at least a portion of the stress material in the second recesses.

3. The method of claim 1, wherein the forming first recesses comprises:
   forming dummy spacers;
   etching the substrate using the dummy spacers as a mask; and
   removing the dummy spacers.

4. The method of claim 1, further comprising forming an etch stop layer after forming the second recesses.

5. The method of claim 4, wherein the etch stop layer is a stress layer.

6. The method of claim 1, further comprising:
   forming a second gate dielectric and a second gate electrode on the substrate; and
   forming second spacers on opposing sides of the second gate electrode, wherein the forming second recesses includes simultaneously forming third recesses in the substrate on opposing sides of the second spacers.

7. The method of claim 6, wherein the first gate electrode and the first spacers form part of a PMOS transistor, and the second gate electrode and the second spacers form part of an NMOS transistor.

8. A method of forming a semiconductor device, the method comprising:
   providing a substrate;
   forming a first gate dielectric and a first gate electrode;
   forming first recesses in the substrate on either side of the first gate electrode, the first recesses being laterally offset from the first gate electrode;
   epitaxially growing a stress material in the first recesses, the stress material extending above a major surface of the substrate;
   forming first spacers on opposing sides of the first gate electrode, the first spacers extending over at least a portion of the stress material;
   recessing, after the forming the first spacers, the stress material not covered by the first spacers, thereby forming a recessed stress material; and
   forming first source/drain regions, the first source/drain regions including first heavily doped regions substantially aligned with the first spacers.

9. The method of claim 8, further comprising siliciding at least a portion of the recessed stress material.

10. The method of claim 8, wherein the forming first recesses comprises:
    forming dummy spacers;
    etching the substrate using the dummy spacers as a mask; and
    removing the dummy spacers.

11. The method of claim 8, further comprising:
    forming a second gate dielectric and a second gate electrode on the substrate;
    forming second spacers on opposing sides of the second gate electrode; and
    recessing the substrate on opposing sides of the second spacers, the recessing the substrate being performed simultaneously as the recessing the stress material.

12. The method of claim 11, wherein the first gate electrode and the first spacers form part of a PMOS transistor, and the second gate electrode and the second spacers form part of an NMOS transistor.

13. The method of claim 12, further comprising forming a compressive stress film over the PMOS transistor and forming a tensile stress film over the NMOS transistor.

14. A method of forming a semiconductor device, the method comprising:
    providing a substrate;
    forming a first gate dielectric and a first gate electrode on the substrate;
    forming a second gate dielectric and a second gate electrode on the substrate;

recessing the substrate on opposing sides of the first gate electrode, thereby forming first recesses, the first recesses being offset from the first gate electrode;

forming a stress layer in the first recesses;

forming, after the forming a stress layer, first spacers on opposing sides of the first gate electrode and second spacers on opposing sides of the second gate electrode;

recessing, after the forming the first spacers, the stress layer adjacent the first spacers; and recessing the substrate adjacent the second spacers.

15. The method of claim 14, further comprising siliciding at least a portion of the stress layer.

16. The method of claim 14, further comprising siliciding at least a portion of the substrate recessed in the recessing the substrate.

17. The method of claim 14, wherein the recessing the substrate comprises:

forming dummy spacers;

etching the substrate using the dummy spacers as a mask; and removing the dummy spacers.

18. The method of claim 14, wherein the forming the stress layer is performed at least in part by epitaxially growing the stress layer.

19. The method of claim 14, wherein the first gate electrode and the first spacers form part of a PMOS transistor, and the second gate electrode and the second spacers form part of an NMOS transistor.

20. The method of claim 19, further comprising forming a compressive stress film over the PMOS transistor and forming a tensile stress film over the NMOS transistor.

* * * * *